US012771217B2

(12) United States Patent
Linko et al.

(10) Patent No.: US 12,771,217 B2
(45) Date of Patent: Oct. 20, 2026

(54) CONTROL MODULE FOR HIGH-POWER ELECTRIC MOTOR

(71) Applicant: Black & Decker Inc., New Britain, CT (US)

(72) Inventors: John T. Linko, Towson, MD (US); Frederick C. Malonzo, Towson, MD (US); Fitzhugh P. Malloy, Towson, MD (US); Alan Mauricio Martinez Sanchez, Cockeysville, MD (US); Luis Enrrique Yon Morales, Baltimore, MD (US)

(73) Assignee: Black & Decker Inc., New Britain, CT (US)

(*) Notice: Subject to any disclaimer, the term of this patent is extended or adjusted under 35 U.S.C. 154(b) by 18 days.

(21) Appl. No.: 18/891,973

(22) Filed: Sep. 20, 2024

(65) Prior Publication Data

US 2026/0088684 A1 Mar. 26, 2026

(51) Int. Cl.

| | |
|---|---|
| ***H05K 1/02*** | (2006.01) |
| ***H02K 11/33*** | (2016.01) |
| ***H05K 1/18*** | (2026.01) |

(52) U.S. Cl.

CPC ........... *H02K 11/33* (2016.01); *H05K 1/0203* (2013.01); *H05K 1/18* (2013.01); *H02K 2211/03* (2013.01); *H05K 2201/10015* (2013.01); *H05K 2201/10053* (2013.01); *H05K 2201/10166* (2013.01); *H05K 2201/10212* (2013.01)

(58) Field of Classification Search

CPC ........ H05K 1/0203; H05K 1/18; H05K 1/181; H05K 1/0204; H05K 1/111; H05K 1/0262; H05K 1/0265; H05K 1/0271; H05K 7/14322; H05K 7/14329; H05K 7/2089; H05K 7/209; H05K 7/1427; H02K 11/33; H02K 2211/03

See application file for complete search history.

(56) References Cited

U.S. PATENT DOCUMENTS

| | | | |
|---|---|---|---|
| 4,535,385 | A | 8/1985 | August et al. |
| 4,972,294 | A | 11/1990 | Moses, Jr. et al. |

(Continued)

FOREIGN PATENT DOCUMENTS

| | | | |
|---|---|---|---|
| CN | 206461885 | U | 9/2017 |
| CN | 209561373 | U | 10/2019 |

(Continued)

*Primary Examiner* — Abhishek M Rathod

(74) *Attorney, Agent, or Firm* — The Webb Law Firm

(57) ABSTRACT

A control module for a high-power electric motor may include a metal base, an insulating wall fastened to the metal base, and a circuit board disposed within the insulating wall. The circuit board may include a first surface that faces the metal base and a second surface opposite the first surface. A plurality of power switches may be mounted on the first surface of the circuit board and configured as an inverter circuit. A thermally conductive electrically insulating layer may be between the circuit board and the metal base. Power output terminals may be mounted on the second surface of the circuit board. An insulating frame may extend between at least one pair of the power output terminals. One or more fasteners may be received through the insulating frame, the circuit board, and the thermally conductive electrically insulating layer and fastened to the metal base.

20 Claims, 14 Drawing Sheets

(56) References Cited

U.S. PATENT DOCUMENTS

| | | | | |
|---|---|---|---|---|
| 5,014,904 | A | 5/1991 | Morton | |
| 5,408,383 | A | 4/1995 | Nagasaka et al. | |
| 5,657,203 | A | 8/1997 | Hirao et al. | |
| 6,535,383 | B2 | 3/2003 | Terhaar et al. | |
| 6,545,879 | B1 | 4/2003 | Goodwin | |
| 6,881,077 | B2 | 4/2005 | Throum | |
| 6,930,386 | B1 | 8/2005 | Cesulka | |
| 7,035,105 | B2 | 4/2006 | Yamaguchi | |
| 7,050,305 | B2 | 5/2006 | Thorum | |
| 7,085,138 | B2 | 8/2006 | Origlia | |
| 7,145,774 | B2 | 12/2006 | Campini et al. | |
| 7,154,753 | B2 | 12/2006 | Kobayashi | |
| 7,345,881 | B2 | 3/2008 | Colbert et al. | |
| 7,359,200 | B2 | 4/2008 | Zhou et al. | |
| 7,382,620 | B2 | 6/2008 | Khanna et al. | |
| 7,417,861 | B2 | 8/2008 | Kikuchi et al. | |
| 7,474,024 | B2 | 1/2009 | Nakanishi | |
| 7,576,989 | B2 | 8/2009 | Li et al. | |
| 7,643,297 | B2 | 1/2010 | Tominaga et al. | |
| 7,684,198 | B2 | 3/2010 | Fang | |
| 7,742,304 | B2 | 6/2010 | Heise et al. | |
| 7,751,193 | B2 | 7/2010 | Tominaga et al. | |
| 7,791,888 | B2 | 9/2010 | Tominaga et al. | |
| 7,870,888 | B2 | 1/2011 | Zhou et al. | |
| 7,965,510 | B2 * | 6/2011 | Suzuki | H05K 7/20927 361/689 |
| 8,605,449 | B2 | 12/2013 | Bussa et al. | |
| 8,625,278 | B2 | 1/2014 | Wang et al. | |
| 8,953,322 | B2 | 2/2015 | Bussa et al. | |
| 9,007,773 | B2 | 4/2015 | Warren et al. | |
| 9,301,385 | B2 | 3/2016 | Kurebayashi et al. | |
| 9,788,411 | B2 | 10/2017 | Tashima | |
| 10,398,021 | B2 | 8/2019 | Avalos et al. | |
| 10,541,588 | B2 | 1/2020 | Wachter et al. | |
| 10,608,501 | B2 * | 3/2020 | Ekstrom | B25F 5/008 |
| 11,095,193 | B2 | 8/2021 | Wachter et al. | |
| 11,469,697 | B2 | 10/2022 | Yajurvedi et al. | |
| 11,558,967 | B2 | 1/2023 | Ookado et al. | |
| 2008/0057279 | A1 | 3/2008 | Fang | |
| 2009/0091897 | A1 * | 4/2009 | Willing | H02M 7/003 361/752 |
| 2014/0002054 | A1 * | 1/2014 | Higashikawa | G01R 1/04 324/76.11 |
| 2015/0206860 | A1 * | 7/2015 | Kontani | H02M 7/003 361/783 |
| 2015/0208500 | A1 * | 7/2015 | Kontani | H05K 1/181 361/783 |
| 2018/0342932 | A1 * | 11/2018 | Wachter | H02K 11/33 |
| 2019/0244874 | A1 * | 8/2019 | Yoshikawa | H05K 7/209 |
| 2019/0246487 | A1 * | 8/2019 | Ito | H05K 7/14322 |
| 2023/0041179 | A1 * | 2/2023 | Wachter | H05K 1/0213 |
| 2024/0072616 | A1 * | 2/2024 | Moturu | H02P 3/04 |

FOREIGN PATENT DOCUMENTS

| | | | |
|---|---|---|---|
| CN | 211455677 | U | 9/2020 |
| CN | 216451593 | U | 5/2022 |
| CN | 218417088 | U | 1/2023 |
| CN | 219917146 | U | 10/2023 |
| CN | 220753408 | U | 4/2024 |
| DE | 4104888 | C2 | 9/1994 |
| DE | 10214311 | A1 | 10/2003 |
| DE | 102012218932 | A1 | 4/2014 |
| DE | 202016105358 | U1 | 1/2018 |
| DE | 102016118147 | B4 | 6/2020 |
| DE | 102014101316 | B4 | 11/2021 |
| DE | 102020216395 | A1 | 6/2022 |
| DE | 102021201248 | A1 | 8/2022 |
| DE | 102021201249 | A1 | 8/2022 |
| DE | 102022202817 | A1 | 9/2023 |
| DE | 102022207435 | A1 | 2/2024 |
| EP | 1638384 | A1 | 3/2006 |
| EP | 1668970 | B1 | 7/2008 |
| EP | 2946886 | B1 | 2/2017 |
| EP | 3799546 | A1 | 3/2021 |
| EP | 4164349 | A1 | 4/2023 |
| JP | 2012129329 | A | 7/2012 |
| JP | 2013117629 | A | 6/2013 |
| TW | 201115308 | A1 | 5/2011 |
| WO | 2019085483 | A1 | 5/2019 |
| WO | WO2022197655 | A1 | 9/2022 |
| WO | WO2023092442 | A1 | 6/2023 |

* cited by examiner

CONTROL MODULE FOR HIGH-POWER ELECTRIC MOTOR

BACKGROUND

1. Technical Field

This disclosure relates generally to an electronic power control module and, in non-limiting embodiments or aspects, to an electronic power control module for a high-power electric motor of an electric power tool.

2. Technical Considerations

Brushless Direct-Current (BLDC) motors are used in many power tools. A typical BLDC motor includes a stator including a series of windings that form three or more phases, and a rotor including a series of magnets that magnetically interact with the stator windings. As the phases of the windings are sequentially energized, they cause rotation of the rotor. BLDC motors generate more power and are more efficient than similarly-sized conventional brushes DC motors and universal motors. BLDC motors are electronically commutated, which may require a control module including a controller and power switching components to commutate proper phases of the motor based on the angular position of the rotor. Size, power delivery, heat dissipation, and manufacturing cost are factors that contribute to a mechanical construction of a control module.

SUMMARY

According to non-limiting embodiments or aspects, provided is a control module including: a metal base; an insulating wall fastened to the metal base; a circuit board disposed within the insulating wall, wherein the circuit board includes a first surface that faces the metal base and a second surface opposite the first surface; a plurality of power switches configured as an inverter circuit, wherein the plurality of power switches is mounted on the first surface of the circuit board; a thermally conductive electrically insulating layer between the circuit board and the metal base; a plurality of power output terminals mounted on the second surface of the circuit board; an insulating frame extending between at least one pair of power output terminals of the plurality of power output terminals; and one or more fasteners received through the insulating frame, the circuit board, and the thermally conductive electrically insulating layer and fastened to the metal base.

In some non-limiting embodiments or aspects, the control module further includes: a plurality of metal slugs mounted on the first surface of the circuit board, wherein the plurality of metal slugs is electrically coupled to the plurality of power switches.

In some non-limiting embodiments or aspects, the plurality of metal slugs is arranged in a plurality of parallel rows on the first surface of the circuit board, wherein the inverter circuit includes a plurality of high-side power switches arranged in a first row on the first surface of the circuit board between a first pair of parallel rows of the plurality of parallel rows of the plurality of metal slugs and a plurality of low-side power switches arranged in a second row on the first surface of the circuit board between a second pair of parallel rows of the plurality of parallel rows of the plurality of metal slugs.

In some non-limiting embodiments or aspects, the control module further includes: at least one shunt component electrically coupled in series with at least one low-side power switch of the plurality of low-side power switches, wherein at least one metal slug of the plurality of metal slugs is electrically coupled to the at least one shunt component, and wherein the at least one shunt component is arranged in a third row on the first surface of the circuit board between a third pair of parallel rows of the plurality of parallel rows of the plurality of metal slugs.

In some non-limiting embodiments or aspects, the plurality of low-side power switches includes three pairs of low-side Field-Effect Transistors (FETs), wherein the plurality of high-side power switches includes three pairs of high-side FETs, wherein each pair of low-side FETs includes two low-side FETs coupled in parallel, and wherein each pair of high-side FETs includes two high-side FETs coupled in parallel.

In some non-limiting embodiments or aspects, the control module further includes: a microcontroller mounted on the second surface of the circuit board, wherein the at least one shunt component is electrically coupled to a pair of low-side FETs of the three pairs of low-side FETs, and wherein the microcontroller is configured to: monitor a current passing through the at least one shunt component; and control, based on the current passing through the at least one shunt component, a field-oriented communication of an electric motor powered by the control module.

In some non-limiting embodiments or aspects, the plurality of power output terminals includes a first power output terminal, a second power output terminal, and a third power output terminal, wherein a first portion of the insulating frame extends between the first power output terminal and the second power output terminal, wherein a second portion of the insulating frame extends between the second power output terminal and the third power output terminal, wherein the one or more fasteners includes a first fastener received through the first portion of the insulating frame that extends between the first power output terminal and the second power output terminal and a second fastener received through the second portion of the insulating frame that extends between the second power output terminal and the third power output terminal, and wherein the first portion and the second portion of the insulating frame are connected by at least one third portion of the insulating frame.

In some non-limiting embodiments or aspects, the plurality of power output terminals includes a plurality of power output posts extending from the second surface of the circuit board.

In some non-limiting embodiments or aspects, the control module further includes: a plurality of capacitors mounted on the second surface of the circuit board; one or more connectors configured to provide at least one of a digital signal, an analog signal, or any combination thereof, mounted on the second surface of the circuit board; and two power input terminals mounted on the second surface of the circuit board.

In some non-limiting embodiments or aspects, the control module further includes: a potting compound disposed within the insulating wall and on each of the first surface and the second surface of the circuit board.

In some non-limiting embodiments or aspects, the metal base is oriented along a first plane, wherein an upper edge of the insulating wall is oriented along a second plane, and wherein the circuit board is oriented between the first and second planes.

In some non-limiting embodiments or aspects, the insulating wall is fastened to the metal base via further fasteners received through the metal base and the insulating wall along second insertion axes opposite insertion axes of the fasteners.

In some non-limiting embodiments or aspects, the insulating frame absorbs at least a portion of a tension force applied by the fasteners to the circuit board.

In some non-limiting embodiments or aspects, a height of the control module including the metal base, the circuit board, and the plurality of power switches is less than or equal to approximately 6.5 mm, and wherein the control module is configured to sustain a continuous current output of approximately 70 A to 90 A at a nominal voltage level of approximately between 50V to 60V for a duration of at least 26 minutes while maintaining a temperature of the plurality of power switches at or below approximately 90 degrees Celsius.

According to non-limiting embodiments or aspects, provided is an electric power tool including: a tool housing; an electric motor disposed in the tool housing; a control module disposed in the tool housing, wherein the control module includes: a metal base; an insulating wall fastened to the metal base; a circuit board disposed within the insulating wall, wherein the circuit board includes a first surface that faces the metal base and a second surface opposite the first surface; a plurality of power switches configured as an inverter circuit, wherein the plurality of power switches is mounted on the first surface of the circuit board; a thermally conductive electrically insulating layer between the circuit board and the metal base; a plurality of power output terminals mounted on the second surface of the circuit board; an insulating frame extending between at least one pair of power output terminals of the plurality of power output terminals; and one or more fasteners received through the insulating frame, the circuit board, and the thermally conductive electrically insulating layer and fastened to the metal base.

In some non-limiting embodiments or aspects, the metal plate forms at least a portion of the tool housing.

In some non-limiting embodiments or aspects, a thickness of the metal plate corresponds to an amount of continuous power consumption of the electric power tool.

According to non-limiting embodiments or aspects, provided is a system including: a power source; a power consuming component; and a control module configured to control a supply of electric power from the power source to the power consuming component, wherein the control module includes: a metal base; an insulating wall fastened to the metal base; a circuit board disposed within the insulating wall, wherein the circuit board includes a first surface that faces the metal base and a second surface opposite the first surface; a plurality of power switches configured as an inverter circuit, wherein the plurality of power switches is mounted on the first surface of the circuit board; a thermally conductive electrically insulating layer between the circuit board and the metal base; a plurality of power output terminals mounted on the second surface of the circuit board; an insulating frame extending between at least one pair of power output terminals of the plurality of power output terminals; and one or more fasteners received through the insulating frame, the circuit board, and the thermally conductive electrically insulating layer and fastened to the metal base.

In some non-limiting embodiments or aspects, the power supply includes at least one battery In some non-limiting embodiments or aspects, the power consuming component includes an electric motor.

Further non-limiting embodiments or aspects are set forth in the following numbered clauses:

Clause 1: A control module comprising: a metal base; an insulating wall fastened to the metal base; a circuit board disposed within the insulating wall, wherein the circuit board includes a first surface that faces the metal base and a second surface opposite the first surface; a plurality of power switches configured as an inverter circuit, wherein the plurality of power switches is mounted on the first surface of the circuit board; a thermally conductive electrically insulating layer between the circuit board and the metal base; a plurality of power output terminals mounted on the second surface of the circuit board; an insulating frame extending between at least one pair of power output terminals of the plurality of power output terminals; and one or more fasteners received through the insulating frame, the circuit board, and the thermally conductive electrically insulating layer and fastened to the metal base.

Clause 2: The control module of clause 1, further comprising: a plurality of metal slugs mounted on the first surface of the circuit board, wherein the plurality of metal slugs is electrically coupled to the plurality of power switches.

Clause 3: The control module of clause 1 or 2, wherein the plurality of metal slugs is arranged in a plurality of parallel rows on the first surface of the circuit board, wherein the inverter circuit includes a plurality of high-side power switches arranged in a first row on the first surface of the circuit board between a first pair of parallel rows of the plurality of parallel rows of the plurality of metal slugs and a plurality of low-side power switches arranged in a second row on the first surface of the circuit board between a second pair of parallel rows of the plurality of parallel rows of the plurality of metal slugs.

Clause 4: The control module of any of clauses 1-3, further comprising: at least one shunt component electrically coupled in series with at least one low-side power switch of the plurality of low-side power switches, wherein at least one metal slug of the plurality of metal slugs is electrically coupled to the at least one shunt component, and wherein the at least one shunt component is arranged in a third row on the first surface of the circuit board between a third pair of parallel rows of the plurality of parallel rows of the plurality of metal slugs.

Clause 5: The control module of any of clauses 1-4, wherein the plurality of low-side power switches includes three pairs of low-side Field-Effect Transistors (FETs), wherein the plurality of high-side power switches includes three pairs of high-side FETs, wherein each pair of low-side FETs includes two low-side FETs coupled in parallel, and wherein each pair of high-side FETs includes two high-side FETs coupled in parallel.

Clause 6: The control module of any of clauses 1-5, further comprising: a microcontroller mounted on the second surface of the circuit board, wherein the at least one shunt component is electrically coupled to a pair of low-side FETs of the three pairs of low-side FETs, and wherein the microcontroller is configured to: monitor a current passing through the at least one shunt component; and control, based on the current passing through the at least one shunt component, a field-oriented communication of an electric motor powered by the control module.

Clause 7: The control module of any of clauses 1-6, wherein the plurality of power output terminals includes a first power output terminal, a second power output terminal, and a third power output terminal, wherein a first portion of the insulating frame extends between the first power output terminal and the second power output terminal, wherein a second portion of the insulating frame extends between the second power output terminal and the third power output terminal, wherein the one or more fasteners includes a first fastener received through the first portion of the insulating frame that extends between the first power output terminal and the second power output terminal and a second fastener received through the second portion of the insulating frame that extends between the second power output terminal and the third power output terminal, and wherein the first portion and the second portion of the insulating frame are connected by at least one third portion of the insulating frame.

Clause 8: The control module of any of clauses 1-7, wherein the plurality of power output terminals includes a plurality of power output posts extending from the second surface of the circuit board.

Clause 9: The control module of any of clauses 1-8, further comprising: a plurality of capacitors mounted on the second surface of the circuit board; one or more connectors configured to provide at least one of a digital signal, an analog signal, or any combination thereof, mounted on the second surface of the circuit board; and two power input terminals mounted on the second surface of the circuit board.

Clause 10: The control module of any of clauses 1-9, further comprising: a potting compound disposed within the insulating wall and on each of the first surface and the second surface of the circuit board.

Clause 11: The control module of any of clauses 1-10, wherein the metal base is oriented along a first plane, wherein an upper edge of the insulating wall is oriented along a second plane, and wherein the circuit board is oriented between the first and second planes.

Clause 12: The control module of any of clauses 1-11, wherein the insulating wall is fastened to the metal base via further fasteners received through the metal base and the insulating wall along second insertion axes opposite insertion axes of the fasteners.

Clause 13: The control module of any of clauses 1-12, wherein the insulating frame absorbs at least a portion of a tension force applied by the fasteners to the circuit board.

Clause 14: The control module of any of clauses 1-13, wherein a height of the control module including the metal base, the circuit board, and the plurality of power switches is less than or equal to approximately 6.5 mm, and wherein the control module is configured to sustain a continuous current output of approximately 70 A to 90 A at a nominal voltage level of approximately between 50V to 60V for a duration of at least 26 minutes while maintaining a temperature of the plurality of power switches at or below approximately 90 degrees Celsius.

Clause 15: An electric power tool comprising: a tool housing; an electric motor disposed in the tool housing; a control module disposed in the tool housing, wherein the control module includes: a metal base; an insulating wall fastened to the metal base; a circuit board disposed within the insulating wall, wherein the circuit board includes a first surface that faces the metal base and a second surface opposite the first surface; a plurality of power switches configured as an inverter circuit, wherein the plurality of power switches is mounted on the first surface of the circuit board; a thermally conductive electrically insulating layer between the circuit board and the metal base; a plurality of power output terminals mounted on the second surface of the circuit board; an insulating frame extending between at least one pair of power output terminals of the plurality of power output terminals; and one or more fasteners received through the insulating frame, the circuit board, and the thermally conductive electrically insulating layer and fastened to the metal base.

Clause 16: The electric power tool of clause 15, wherein the metal plate forms at least a portion of the tool housing.

Clause 17: The electric power tool of clause 15 or 16, wherein a thickness of the metal plate corresponds to an amount of continuous power consumption of the electric power tool.

Clause 18: A system comprising: a power source; a power consuming component; and a control module configured to control a supply of electric power from the power source to the power consuming component, wherein the control module includes: a metal base; an insulating wall fastened to the metal base; a circuit board disposed within the insulating wall, wherein the circuit board includes a first surface that faces the metal base and a second surface opposite the first surface; a plurality of power switches configured as an inverter circuit, wherein the plurality of power switches is mounted on the first surface of the circuit board; a thermally conductive electrically insulating layer between the circuit board and the metal base; a plurality of power output terminals mounted on the second surface of the circuit board; an insulating frame extending between at least one pair of power output terminals of the plurality of power output terminals; and one or more fasteners received through the insulating frame, the circuit board, and the thermally conductive electrically insulating layer and fastened to the metal base.

Clause 19: The system of clause 18, wherein the power supply includes at least one battery.

Clause 20: The system of clause 18 or 19, wherein the power consuming component includes an electric motor.

These and other features and characteristics of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosed subject matter.

BRIEF DESCRIPTION OF THE DRAWINGS

Additional advantages and details are explained in greater detail below with reference to the non-limiting, exemplary embodiments that are illustrated in the accompanying schematic figures, in which.

DETAILED DESCRIPTION

Figure 1:
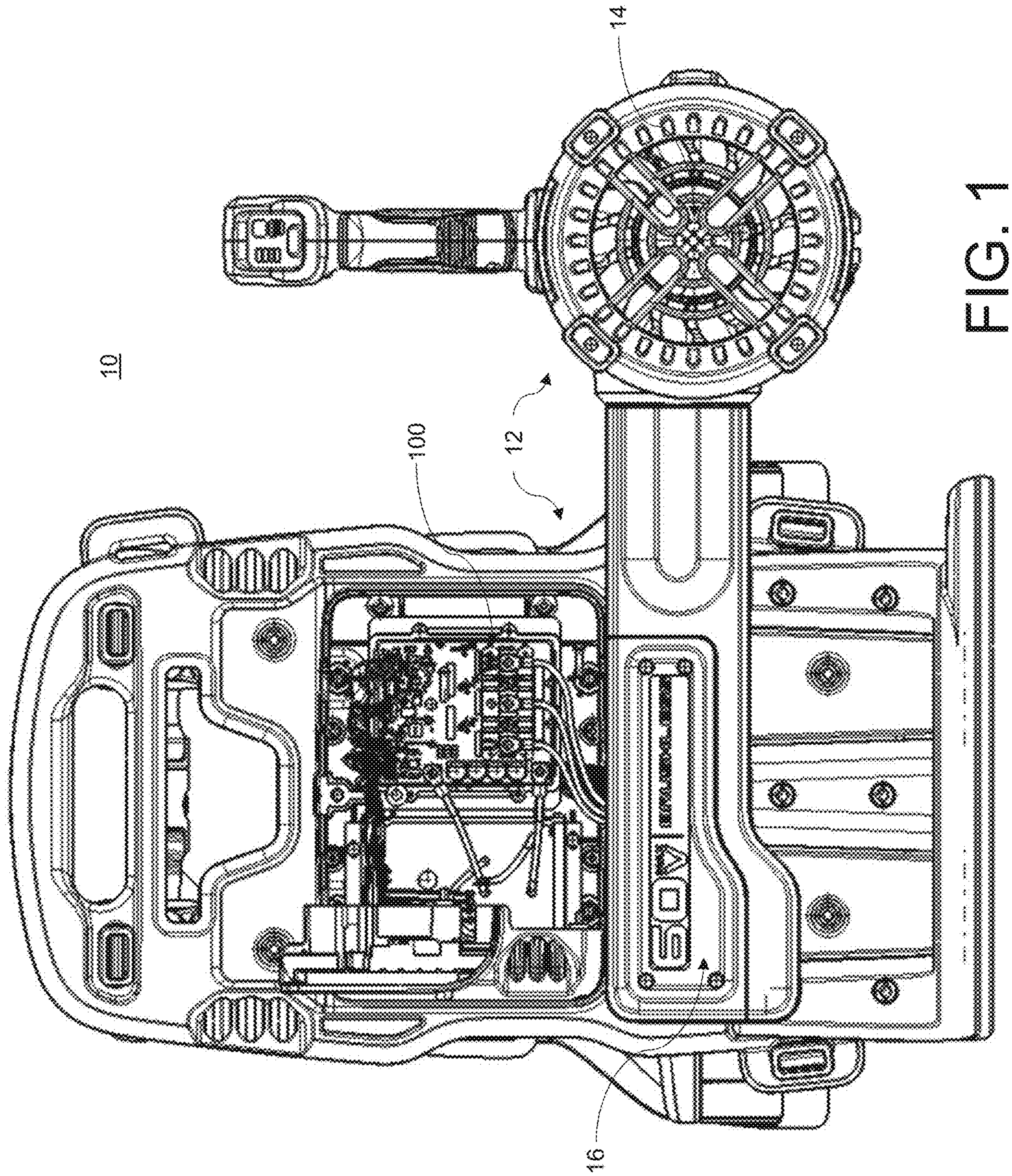
FIG. 1 depicts a side view of a power tool (e.g., a battery powered backpack blower) with a housing half removed, according to some non-limiting embodiments or aspects.

For purposes of the description hereinafter, the terms "end," "upper," "lower," "right," "left," "vertical," "horizontal," "top," "bottom," "lateral," "longitudinal," and derivatives thereof shall relate to the embodiments as they are oriented in the drawing figures. However, it is to be understood that the embodiments may assume various alternative variations and step sequences, except where expressly specified to the contrary. It is also to be understood that the specific devices and processes illustrated in the attached drawings, and described in the following specification, are simply exemplary embodiments or aspects of the disclosed subject matter. Hence, specific dimensions and other physical characteristics related to the embodiments or aspects disclosed herein are not to be considered as limiting.

It is to be understood that the present disclosure may assume various alternative variations and step sequences, except where expressly specified to the contrary. It is also to be understood that the specific devices and processes illustrated in the attached drawings, and described in the following specification, are simply exemplary and non-limiting embodiments or aspects. Hence, specific dimensions and other physical characteristics related to the embodiments or aspects disclosed herein are not to be considered as limiting.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise. In addition, reference to an action being "based on" a condition may refer to the action being "in response to" the condition. For example, the phrases "based on" and "in response to" may, in some non-limiting embodiments or aspects, refer to a condition for automatically triggering an action (e.g., a specific operation of an electronic device, such as a computing device, a processor, and/or the like).

Some of the techniques described herein may be implemented by one or more computer programs executed by one or more processors residing, for example on a power tool or power equipment. The computer programs may include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

FIG. 1 depicts a side view of power tool 10 (e.g., a battery powered backpack blower, etc.) with tool housing 12 half removed, according to some non-limiting embodiments or aspects. As shown in FIG. 1, power tool 10 may include tool housing 12, electric motor 14 (e.g., a high-power electric motor, etc.) disposed in tool housing 12, and/or control module 100 disposed in tool housing 12. Electric motor 14 may include a brushless DC motor, such as an electric brushless direct-current (BLDC) drive motor, and/or the like.

Control module 100 may include a microcontroller, a microprocessor, or other programmable semiconductor chip and power switching components for controlling a commutation of electric motor 14. Alternatively, control module 100 may include an Application Specific Integrated Circuit (ASIC) and the power switching components. Control module 100 may be coupled to power source 16, which may include a DC power source (e.g., a removable battery pack, etc.) or an AC power source (e.g., a 120V AC, etc.). Control module 100 may control or regulate a supply of electric power from power source 16 to electric motor 14, for example, based on a logic signal from an input unit (not shown) electrically coupled to control module 100.

Some non-limiting embodiments or aspects of the present disclosure are focused on the structure and features of control module 100. Details of the components and operation of an exemplary battery powered backpack blower are beyond the scope of this disclosure and can be found in U.S. Pat. Nos. 10,111,565 and 9,907,234, which are incorporated herein by reference in their entireties. It is further noted that while electric motor 14 of this disclosure is described with reference to a battery powered backpack blower according to non-limiting embodiments or aspects, electric motor 14 may similarly be used in other power tools and other devices.

It is noted herein that while some non-limiting embodiments or aspects of the present disclosure are described with reference to a battery powered backpack blower, control module 100 and associated components discussed herein can be used with any system for controlling a supply of electric power from a power source to a power consuming component, such as any brushless control application, and particularly in any power tool or motorized outdoor product application. For example, control module 100 may be used with a brushless motor in a drill, impact driver, grinder, saw, sander, tapper, nailer, powered cart and wheel barrow, lawn mower, lawn and garden tractor, lawn trimmer, lawn edger, lawn and leaf blower or sweeper, hedge trimmer, pruner, lopper, chainsaw, rake, pole saw, tiller, cultivator, aerator, log splitter, post hole digger, trencher, stump grinder, snow thrower (or any other snow or ice cleaning or clearing implement), lawn, wood and leaf shredder and chipper, lawn and/or leaf vacuum, pressure washer, lawn equipment, garden equipment, driveway sprayer and spreader, sports field marking equipment, or any other power tool or power consuming equipment.

Figure 2:
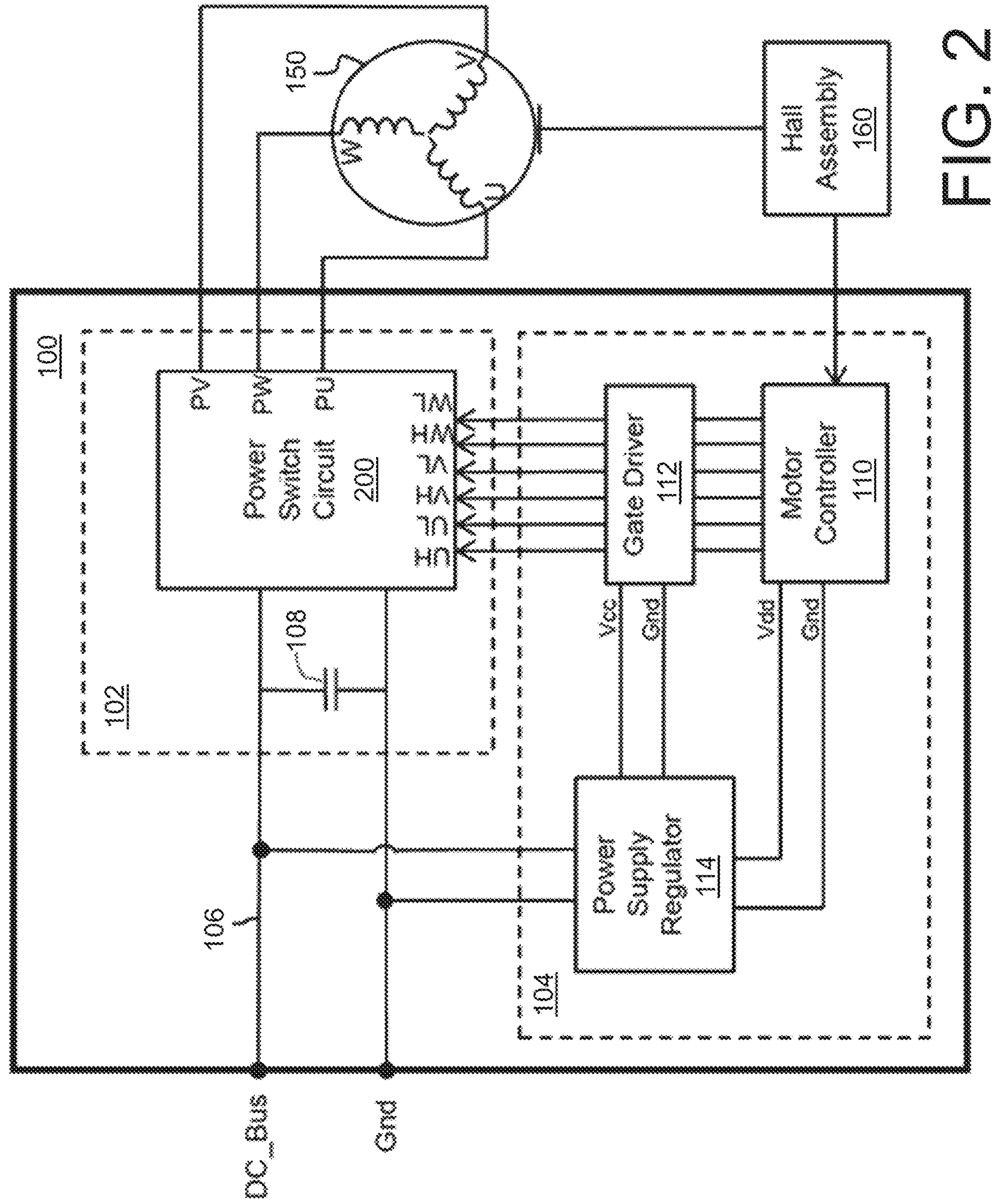
FIG. 2 depicts a block circuit diagram of a control module mounted in connection with a stator assembly of a corresponding electric motor, according to some non-limiting embodiments or aspects.

FIG. 2 depicts a block circuit diagram of control module 100 mounted in connection with stator assembly 150 of electric motor 14, according to some non-limiting embodiments or aspects. Control module 100 may include power unit 102 and/or control unit 104.

Power unit 102 may include power switch circuit 200 coupled between DC bus line 106 and stator assembly 150 to drive electric motor 14. In some implementations, power switch circuit 200 may include a three-phase inverter bridge driver circuit including controllable semiconductor power switches (e.g. FETs, BJTs, IGBTs, etc.). In some implementations, power unit 102 may include DC bus capacitor 108 provided across DC bus line 106 and Gnd.

Control unit 104 may include motor controller 110, gate driver 112, and/or power supply regulator 114. Motor controller 110 may include a programmable device arranged to control a switching operation of power switches in power switch circuit 200. Ins some implementations, motor controller 110 may receive rotor rotational position signals from Hall assembly 160 or other types of positional sensors that interact with a rotor. It should also be noted, however, that motor controller 110 may be configured to calculate or detect rotational positional information relating to the motor rotor using a sensorless control technique such as field-oriented control. In some implementations, motor controller 110 may receive a variable-speed signal that relates to a desired speed of electric motor (e.g., a desired speed set by an operator, etc.). Based on the rotor rotational position signals from Hall assembly 160 or the other types of positional sensors and the variable-speed signal, motor controller 110 may control a pulse-width modulation (PWM) control of drive signals UH, VH, WH, UL, VL, and WL through the gate driver 112, which may provide a voltage level needed to drive gates of semiconductor power switches within power switch circuit 200 in order to control a PWM switching operation of power switch circuit 200.

Power supply regulator 114 may include one or more voltage regulators to step down a power supply to a voltage level compatible for operating motor controller 110 and/or gate driver 112. In some implementations, power supply regulator 114 may include a buck converter and/or a linear regulator to reduce the power voltage of DC bus line 106 to, for example, 15V for powering gate driver 112 and down to, for example, 3.2V for powering motor controller 110.

Figure 3:
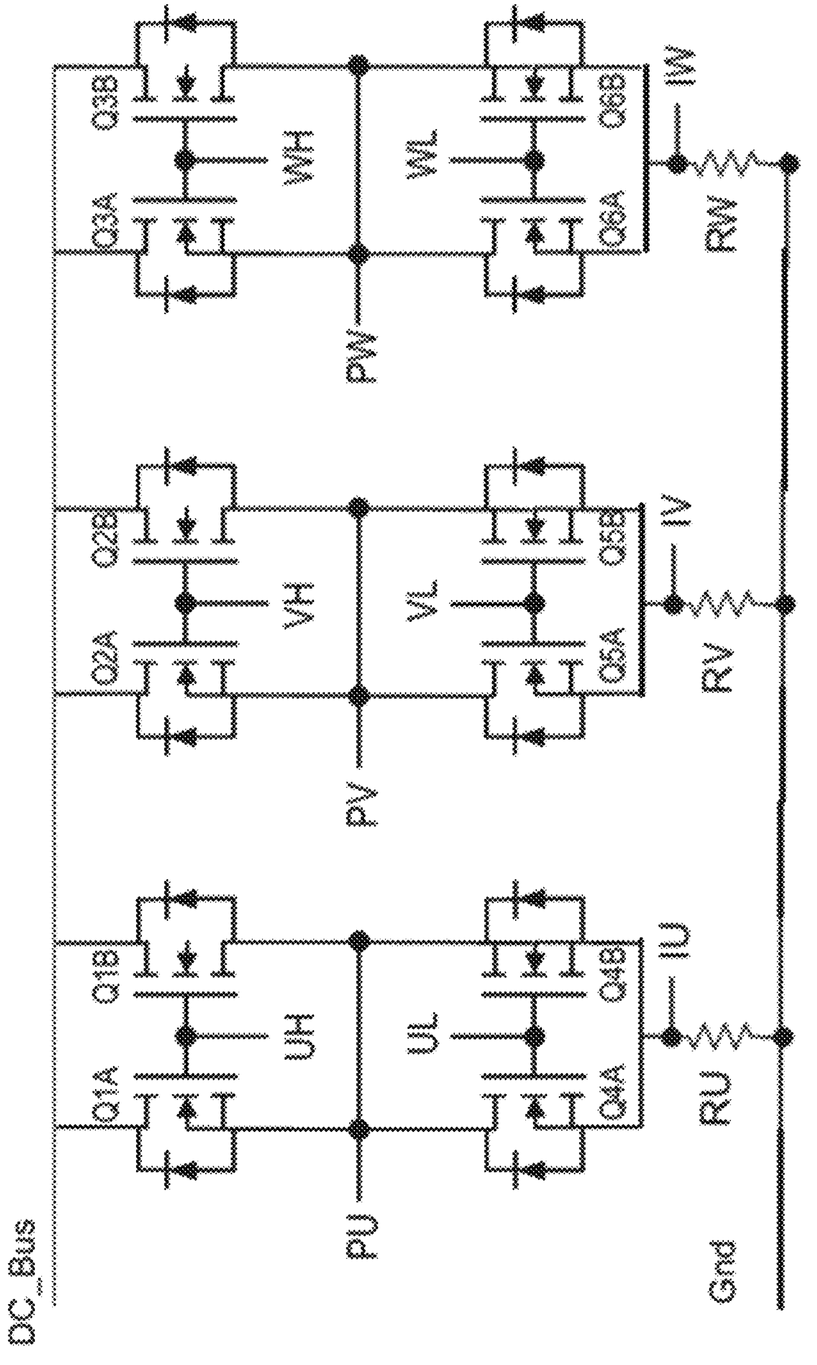
FIG. 3 depicts a circuit diagram of a power switch circuit of a control module, according to some non-limiting embodiments or aspects.

FIG. 3 depicts a circuit diagram of power switch circuit 200 of control module 100, according to some non-limiting embodiments or aspects. As shown in FIG. 3, the three-phase inverter bridge driver circuit of power switch circuit 200 may include three pairs of high-side power switches (Q1A and Q1B, Q2A and Q2B, and Q3A and Q3B) and three pairs of low-side power switches (Q4A and Q4B, Q5A and QSB, and Q6A and Q6B). The power switches in each pair are provided in parallel to reduce the load on each power switch. The gates of the high-side pair of power switches are driven via drive signals UH, VH, and WH, and the gates of the low-side pairs of power switches are driven via drive signals UL, VL, and WL. In some implementations, the drains of the high-side pairs of power switches are coupled to the sources of the low-side pairs of power switches to output power signals PU, PV, and PW for driving electric motor 14.

The power switches may be, for example, Metal Oxide Field Effect Transistors (MOSFETs, or FETs for short), as shown in FIG. 3, through it must be understood that Insulated-Gate Bipolar Transistors (IGBTs), Bipolar Junction Transistors (BJTs), or similar semiconductor switches may be alternatively utilized. In this example, twelve FETs (e.g., the three pairs of high-side FETs (Q1A and Q1B, Q2A and Q2B, and Q3A and Q3B) and the three pairs of low-side FETs (Q4A and Q4B, Q5A and QSB, and Q6A and Q6B) are being utilized for power switch circuit 200. However, non-limiting embodiments or aspects of the present disclosure are not limited thereto and six power switches (e.g., three high-side FETs and three low-side FETs, etc.) may be utilized for power switch circuit 200, for example, as disclosed in U.S. Pat. Nos. 11,469,697; 10,497,524; 10,693,344; 10,786,894; 11,370,100; and 10,873,244, each of which is incorporated herein by reference in its entirety. Alternatively, more than the two power switches may be used for each pair of the three pairs of high-side power switches (Q1A and Q1B, Q2A and Q2B, and Q3A and Q3B) and the three pairs of low-side power switches (Q4A and Q4B, Q5A and QSB, and Q6A and Q6B) of power switch circuit 200 for higher power applications, for example. While this disclosure makes references to FETs, it should be understood that any such power switches may be alternatively used. The gates of the power switches may be controlled by a microcontroller in the control unit 104 coupled to gate driver 112.

As further shown in FIG. 3, in some implementations, at least one of shunt resistor RU, shunt resistor RV, shunt resistor RW, or any combination thereof may be electrically coupled in series with a corresponding low-side pair of FETs (Q4A and Q4B, Q5A and QSB, and/or Q6A and Q6B) to measure phase currents of stator assembly 150 (e.g., phase currents through phases of electric motor 14, etc.), which may enable sensorless Field-Oriented control of electric motor 14. In FIG. 3, the motor phase currents are represented by signals IU, IV, and IW for simplicity, though it should be understood that motor controller 110 measures the voltage across shunt resistor RU, RV, and/or RW to calculate the phase current therethrough. In FIG. 3, motor controller 110 may receive only one node of RU, RV, and RW, because the other nodes of RU, RV, and RW are commonly coupled to the negative terminal or Gnd of the power supply.

In some implementations, motor controller 110 may measure only two of the phase currents IU and IV and calculate the third phase current IW using Kirchhoff's current law, IU+IV+IW=0. It should be understood that motor controller 110 may alternatively receive other combinations of two signal currents (e.g., IU and IW, or IV and IW, etc.). Alternatively, motor controller 110 may receive all three current signals and rely on Kirchhoff's current law as means of redundant current measurement to ensure against circuit component failure.

In power tool applications, particularly cordless tools where size is limited, addition of the two or three shunt resistors described above to the power tool circuit may present challenges. In some implementations, instead of the two or three additional shunt resistors, resistive characteristics of the FETs may be taken advantage of to measure the motor current. For example, in some implementations, no dedicated shunt resistors may be provided, and the low-side FETs (Q4A and Q4B, Q5A and QSB, and/or Q6A and Q6B) themselves may be used for current measurement. The FETs may have a predominantly resistive conduction mode when in the ON-state, which can be of the order of a few milliohms or less. Thus, in an embodiment, the resistive conduction of the low-side FETs (Q4A and Q4B, Q5A and QSB, and/or Q6A and Q6B) may be leveraged in place of shunt resistors, allowing motor controller 110 to calculate the current on each motor phase. By way of example, in FIG. 3, instead of measuring current using shunt resistors RU, RV, and/or RW and via signals IU, IV, and/or IW, motor controller 110 may measure current passing through low-side FETs Q4A, Q5A, and/or Q6A via signals PU, PV and PW, as described in U.S. Pat. No. 11,469,697, which is incorporated herein by reference in its entirety.

Some non-limiting embodiments or aspects of the mechanical construction of control module 100 are described herein with reference to FIGS. 4A-12.

Figure 4A:
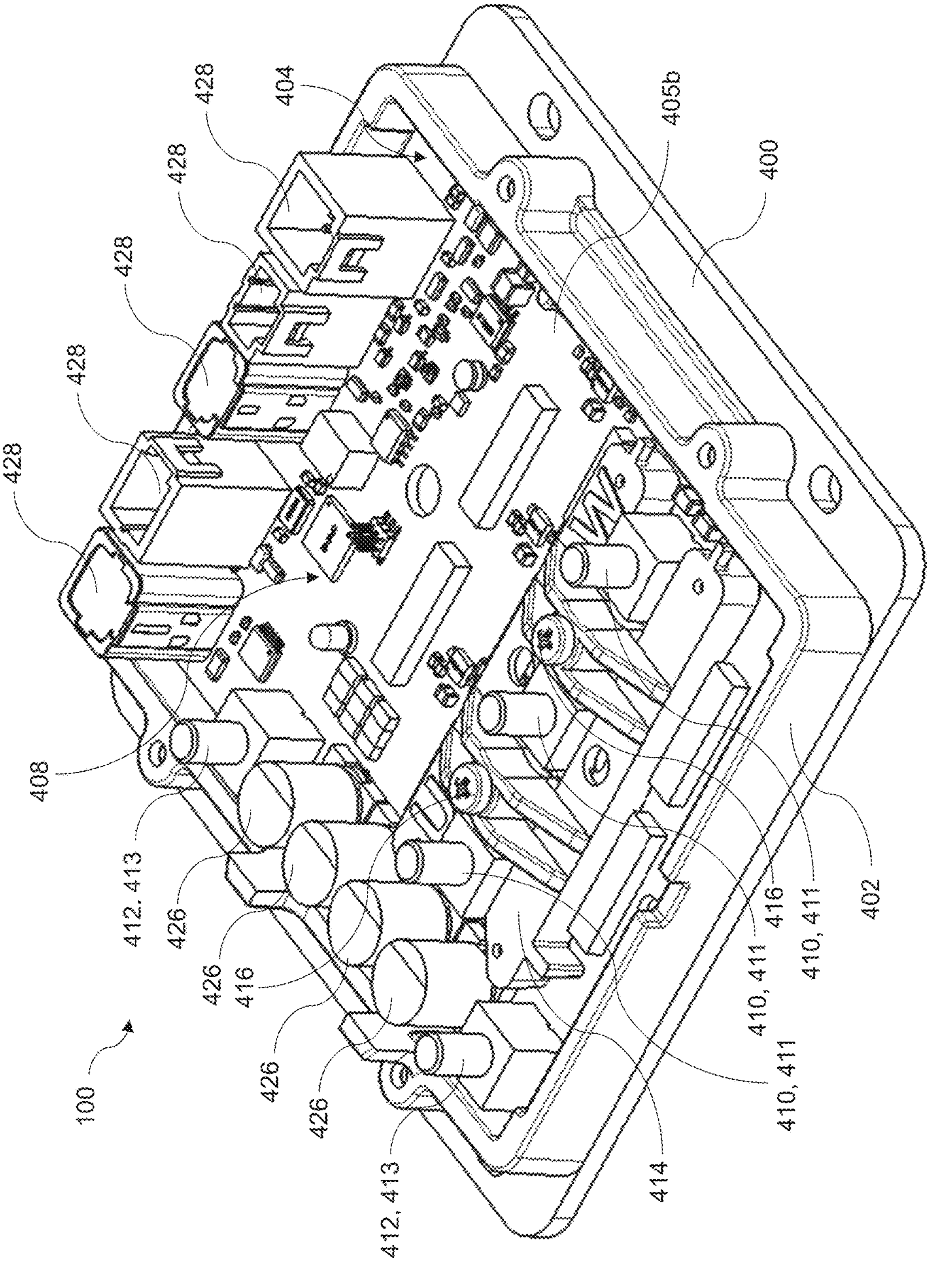
FIGS. 4A and 4B depict perspective views of a control module, according to some non-limiting embodiments or aspects.
Figure 4B:
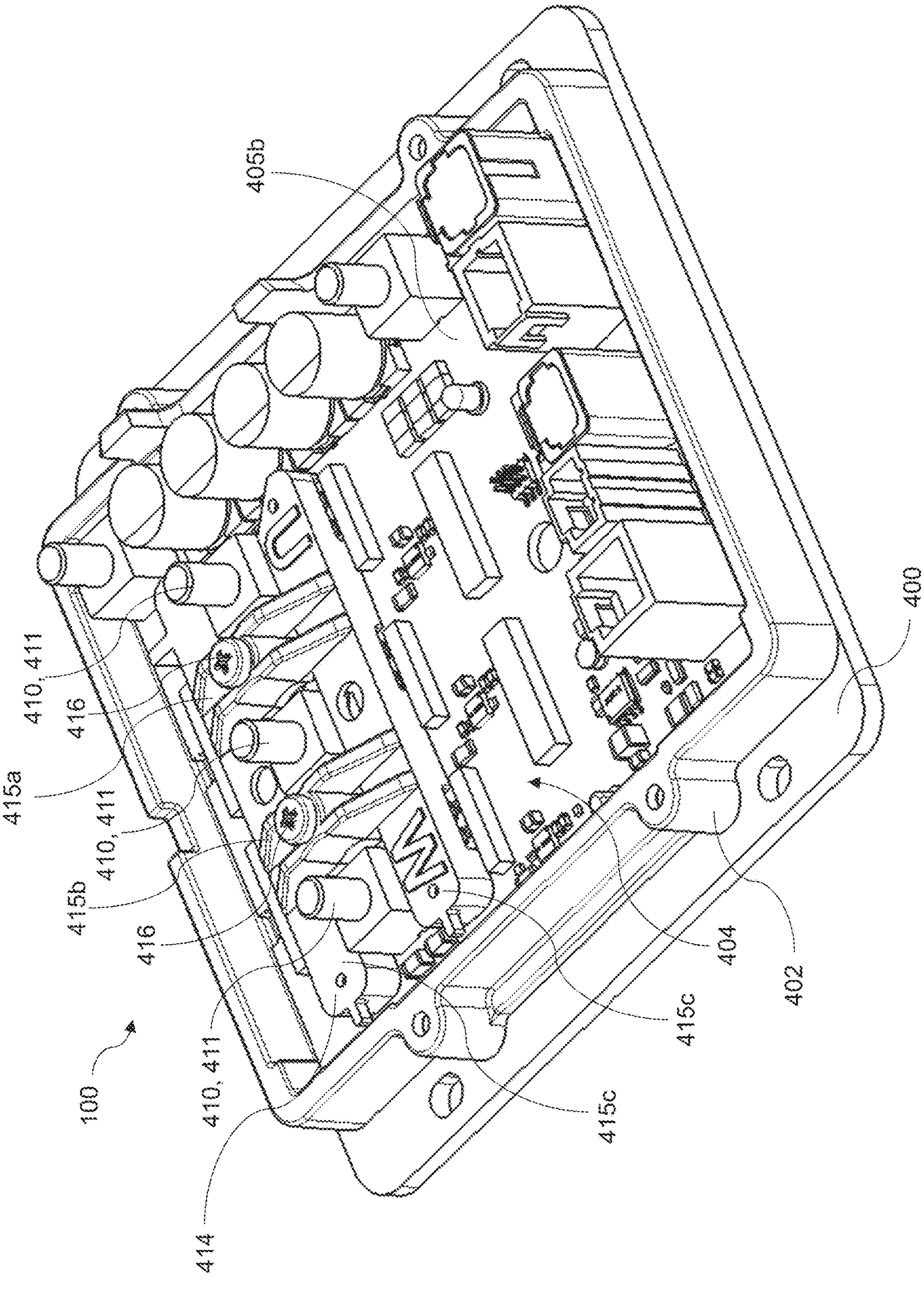

FIGS. 4A and 4B depict perspective views of control module 100, according to some non-limiting embodiments or aspects. Control module 100 may include metal base 400, insulating wall 402 (e.g., a plastic wall, a metal and plastic wall, an at least partially plastic coated metal wall, etc.) fastened to metal base 400, and/or circuit board 404. Circuit board 404 may be disposed within insulating wall 402. For example, circuit board 404 may be horizontally received within insulating wall 402. As an example, metal base 400 may be oriented along a first plane, an upper edge of insulating wall 402 may be oriented along a second plane, and circuit board 404 may be oriented between the first and second planes. Metal base 400 may act as a heat sink for control module 100. A thickness of metal base 400 may correspond to an amount of continuous power consumption of electric motor 14 and/or electric power tool 10. In some implementations, metal base 400 may form at least a portion of tool housing 12 of electric power tool 10.

Figure 5:
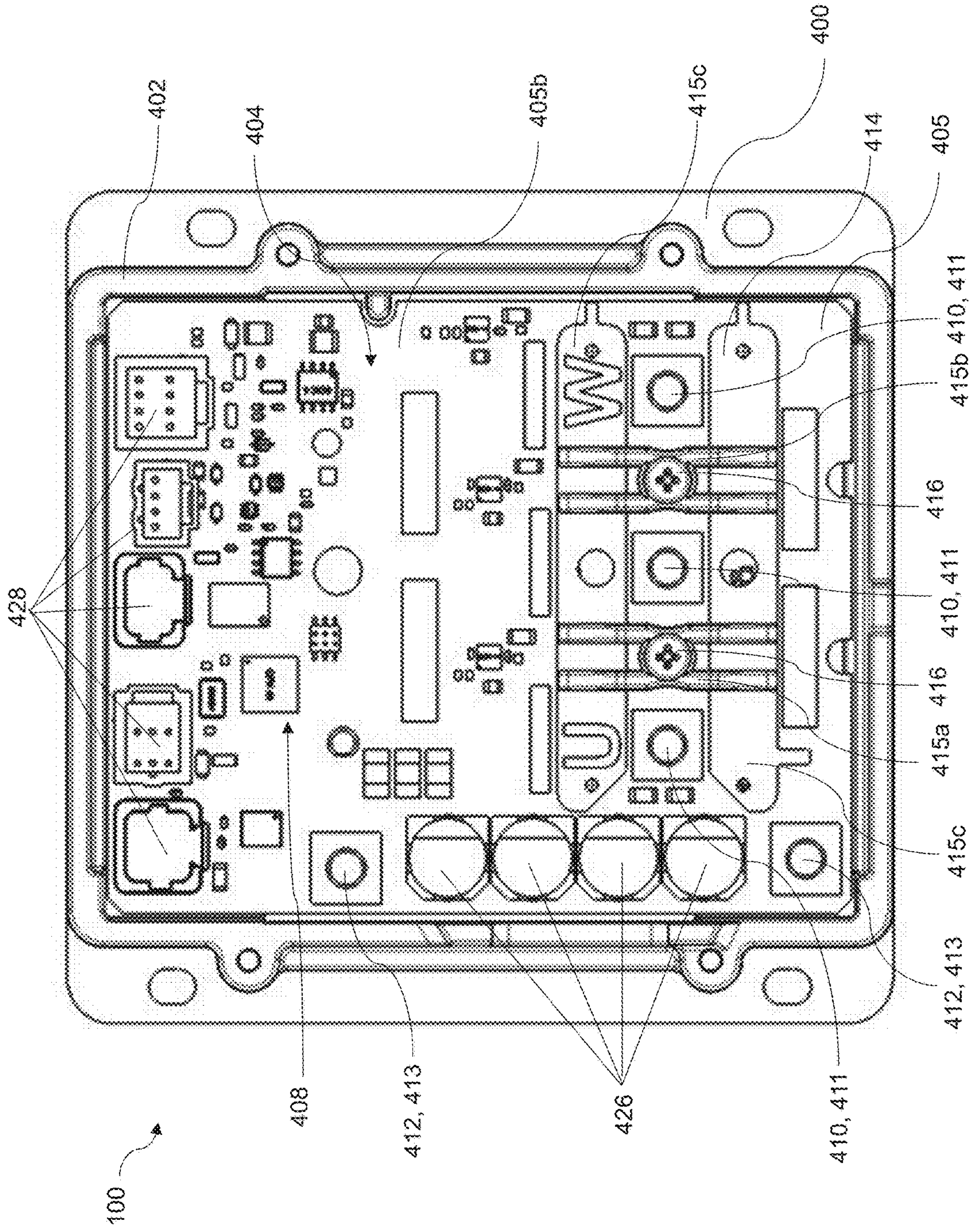
FIG. 5 depicts a top view of a control module, according to some non-limiting embodiments or aspects.
Figure 6:
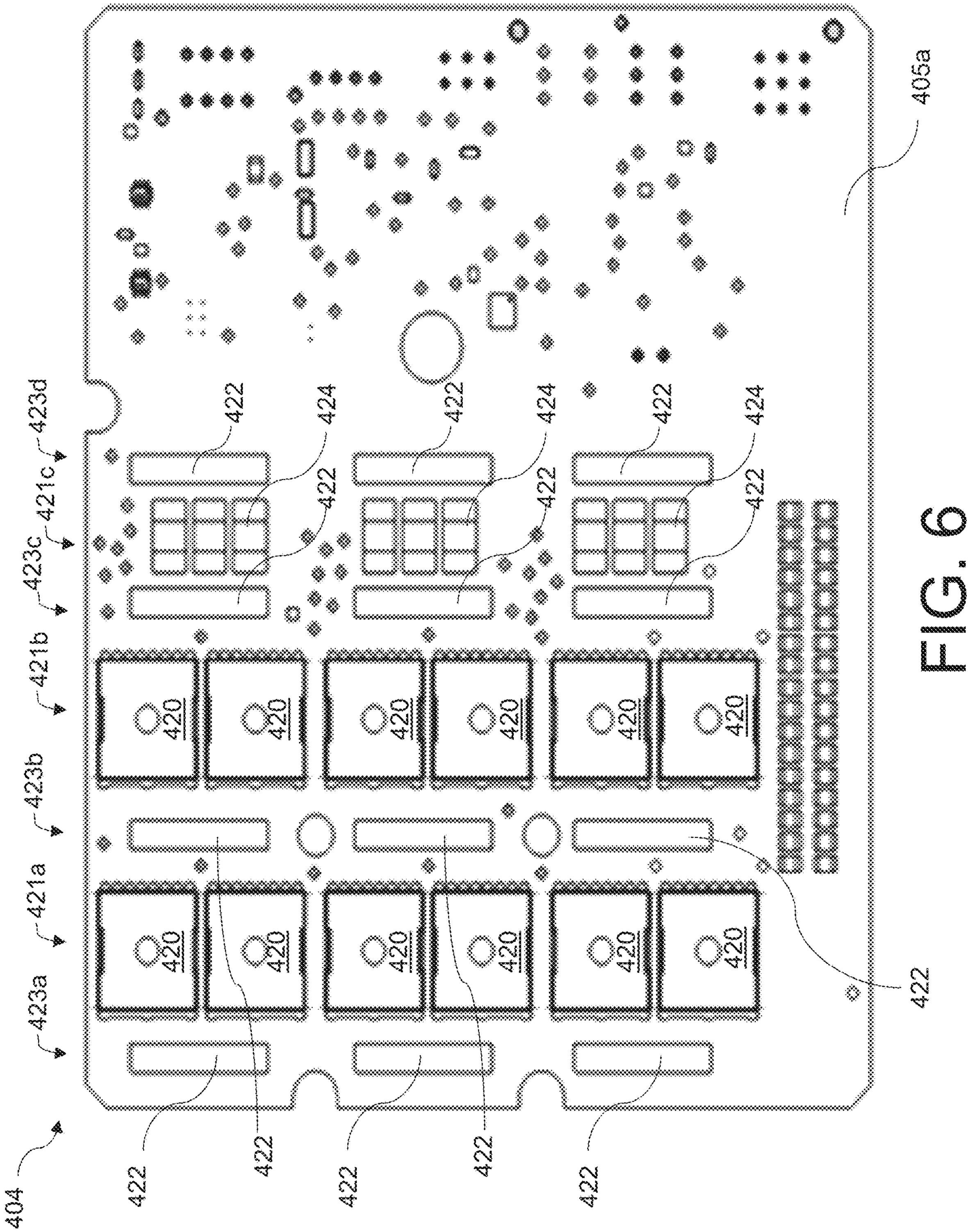
FIG. 6 depicts a bottom view of a circuit board assembly of a control module, according to some non-limiting embodiments or aspects.

FIG. 5 depicts a top view of control module 100, according to some non-limiting embodiments or aspects. FIG. 6 depicts a bottom view of circuit board assembly 404 of control module 100, according to some non-limiting embodiments or aspects. As shown in FIGS. 5 and 6, and with continued reference to FIGS. 4A and 4B, circuit board 404 may include first surface 405*a* that faces metal base 400 and second surface 405*b* opposite first surface 450*a* (e.g., that faces away from metal base 400, etc.).

Figure 7:
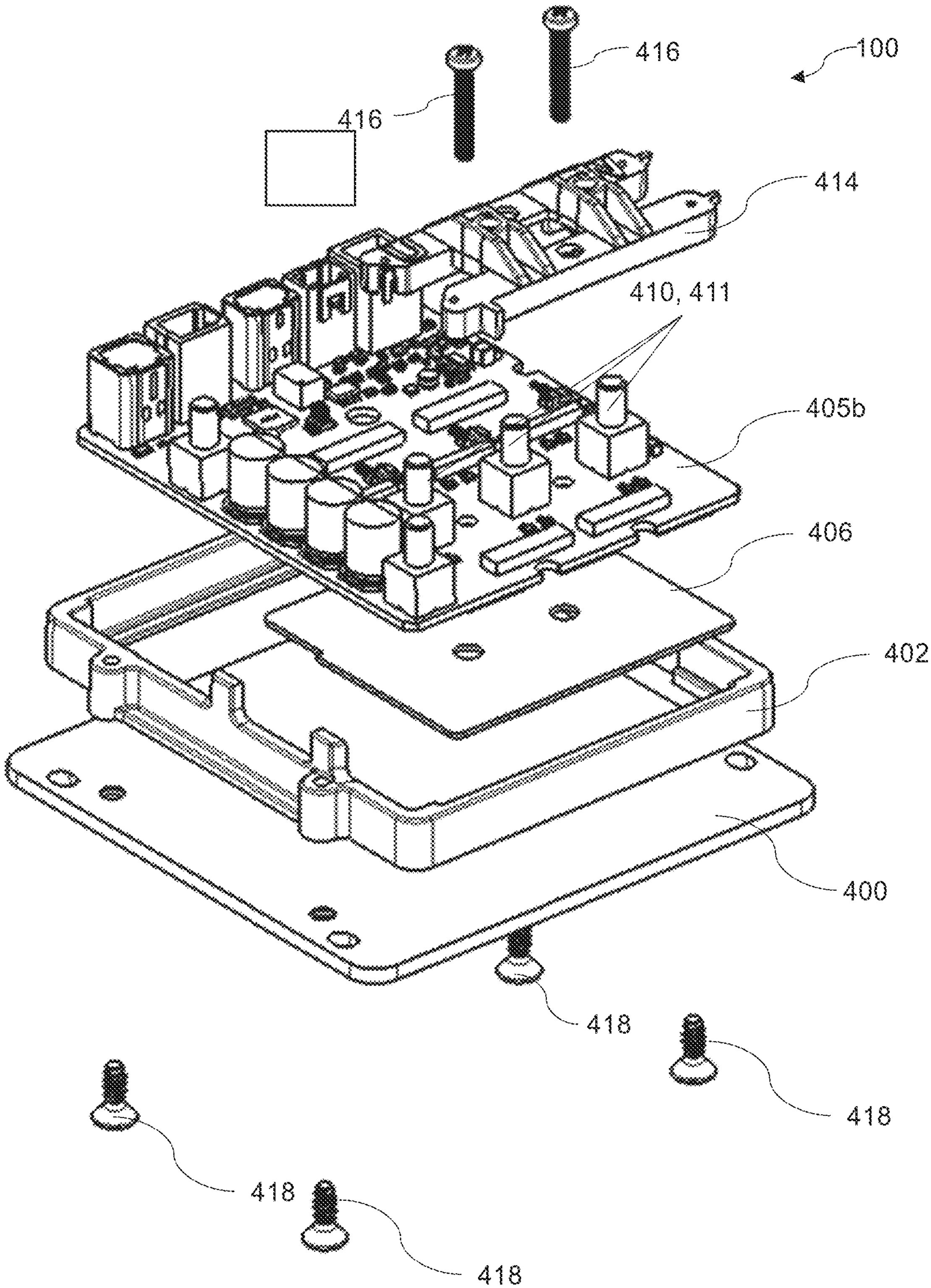
FIG. 7 depicts a top exploded perspective view of a control module, according to some non-limiting embodiments or aspects.
Figure 8:
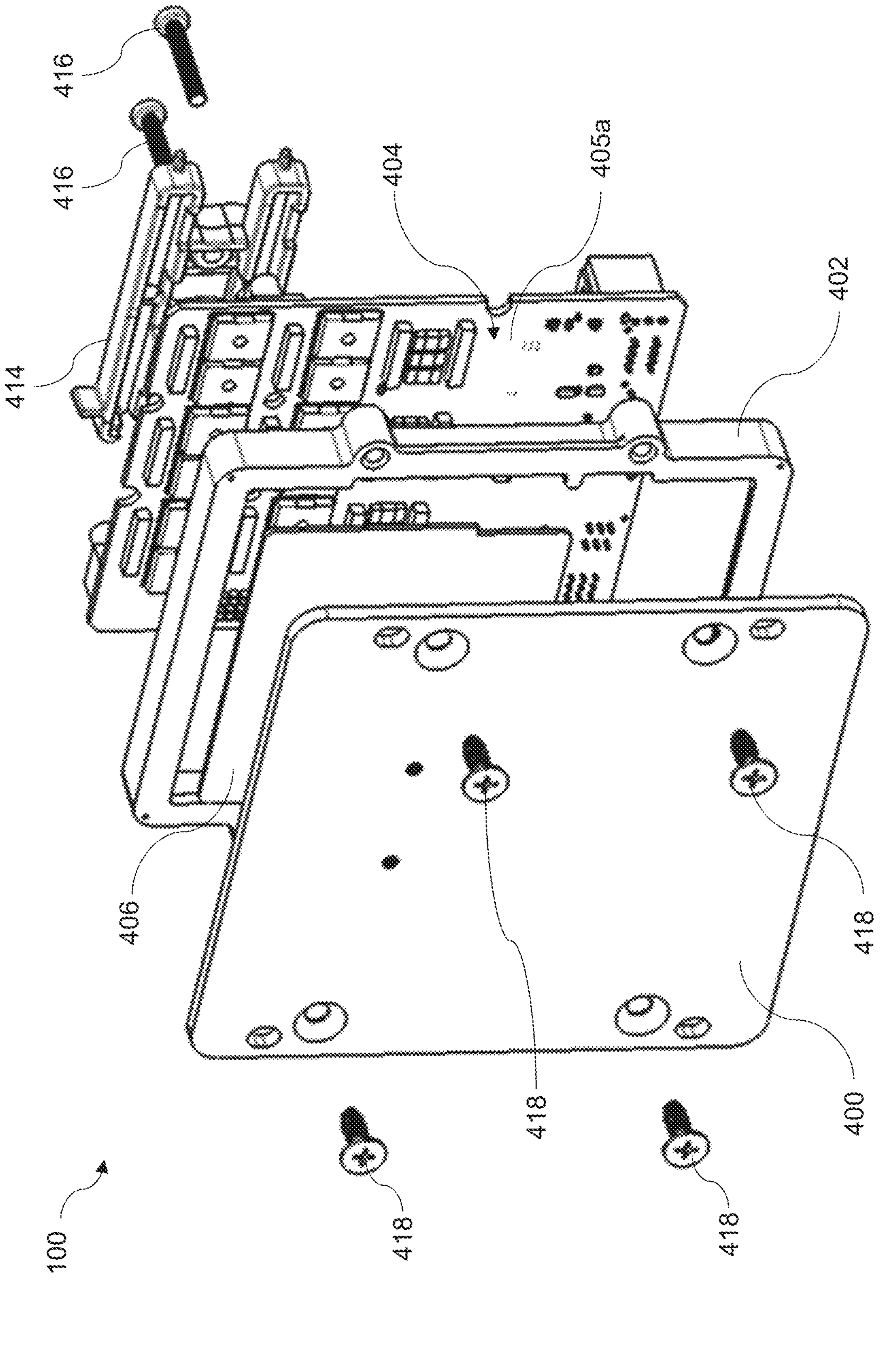
FIG. 8 depicts a bottom exploded perspective view of a control module, according to some non-limiting embodiments or aspects.

FIG. 7 depicts a top exploded perspective view of control module 100, according to some non-limiting embodiments or aspects. FIG. 8 depicts a bottom exploded perspective view of control module 100, according to some non-limiting embodiments or aspects. As shown in FIGS. 7 and 8, and with continued reference to FIGS. 4A-6, thermally conductive electrically insulating layer 406 may be disposed between circuit board 404 and metal base 400. In some implementations, thermally conductive electrically insulating layer 406 may include a thermal gap pad. Alternatively, or additionally, thermally conductive electrically insulating layer 406 may include thermal grease or paste. Thermally conductive electrically insulating layer 406 may be disposed between heat-generating electronics components of circuit board 404 and metal base 400, which acts as a heat-dissipating surface. For example, thermally conductive electrically insulating layer 406 may be sized to cover an area of first face 405*a* of circuit board 404 that includes power switches 420, metal slugs 422, and/or shunt components 424 (e.g., without covering a remaining area of first face 405*a* of circuit board 404 that includes other components than power switches 420, metal slugs 422, and/or shunt components 424, etc.). In some implementations, thermally conductive electrically insulating layer 406 may be sized to cover an entire area of first face 405*a* of circuit board 400.

Still referring to FIGS. 4A-8, a plurality of power output terminals 410 may mounted on second surface 405*b* of circuit board 404. For example, the plurality of power output terminals 410 may include a plurality of power output posts 411 extending from the second surface of circuit board 404. As an example, the plurality of power output terminals 410 or posts 411 may include a first power output terminal or post, a second power output terminal or post, and a third power output terminal or post (e.g., three power output terminals 410 or posts 411, etc.). The three power output terminals 410 or posts 411 may be arranged in a row with the second power output terminal or post between the first power output terminal or post and the third power output terminal or post. The three power output terminals 410 or posts 411 may be mounted near a front edge of circuit board 404 on second surface 405*b* for coupling to the phases PU, PV, PW of electric motor 14.

A plurality of power input terminals 412 may be mounted on second surface 405*b* of circuit board 404. For example, the plurality of power input terminals 412 may include a plurality of power input posts 413 extending from second surface 405*b* of circuit board 404. As an example, the plurality of power input terminals 412 or posts 413 may include two power input terminals 412 or posts 413. The two power input terminals 412 or posts 413 may be mounted near a left side edge of circuit board 404 that extends perpendicular to the front edge of circuit board 404.

Insulating frame 414 may extend between at least one pair of power output terminals 410 or posts 411 of the plurality of power output terminals 410 or posts 411. For example, a first portion 415*a* of insulating frame 414 may extend between the first power output terminal or post and the second power output terminal or post, a second portion 415*b* of insulating frame 414 may extend between the second power output terminal or post and the third power output terminal or post, and/or the first portion 415*a* and the second portion 415*b* of insulating frame 414 may be connected by at least one third portion 415*c* of insulating frame 414. In this way, insulating frame 414 may inhibit or prevent metal particles and/or post breakage from electrically connecting adjacent power output terminals or posts of the plurality of power output terminals 410 or posts 411. First portion 415*a* and/or second portion 415*b* of insulating frame 414 may extend a same distance, a greater distance, or a shorter distance from circuit board 404 as the plurality of power output terminals 410 or posts 411 when insulating frame 414 is fastened to circuit board 404 and metal base 400. For example, taller first and/or second portions 415*a*, 415*b* of insulating frame 414 may provide better protection against electrical connection of adjacent power output posts, and shorter first and/or second portions 415*a*, 415*b* of insulating frame 414 may provide easier access to the plurality of power output terminals 410 or posts 411. In some implementations, the at least one third portion 415*c* of insulating frame 414 may include a first third portion that extends parallel to a first side of the row of three power output terminals 410 or posts 411 a second portion that extends parallel to a second side opposite the first side of the row of three power output terminals 410 or posts 411, which may increase an overall structural rigidity of insulating frame 414. As shown, for example, in FIG. 5, portions the at least one third portion 415*c* of insulating frame 414 adjacent the plurality of power output terminals 410 or posts 411 may include markings (e.g., molded markings, labels, etc.) that indicate phases of the respective the plurality of power output terminals 410 or posts 411.

One or more fasteners 416 may be received through insulating frame 414, circuit board 404, and/or thermally conductive electrically insulating layer 406 and fastened to metal base 400. For example, the one or more fasteners 416 may include a first fastener 416 received through first portion 415*a* of insulating frame 414 that extends between the first power output terminal and the second power output terminal and a second fastener 416 received through second portion 415*b* of insulating frame 414 that extends between the second power output terminal and the third power output terminal. In this way, insulating frame 414 may absorb at least a portion of a tension force applied by the one or more fasteners 416 to circuit board 404.

Insulating wall 402 may be fastened to metal base 400 via further fasteners 418 received through metal base 400 and insulating wall 402 along insertion axes opposite insertion axes of the one or more fasteners 416. Insulating wall 402 may enclose or surround circuit board 404 when circuit board 404 is disposed within insulating wall 402. For example, insulating wall 402 fastened to metal base 400 may form a potting boat in which circuit board 404 may be disposed with potting compound 430 (FIGS. 9-11) around first and/ second surfaces 405*a* and 405*b* of circuit board 404. In some implementations, insulating wall 402 may not support any portion of circuit board 404. Alternatively, at least a portion of an interior of insulating wall 402 may include a flange extending therefrom on which at least a portion of circuit board 404 may rest or be supported. In such an example, the flange may be configured to hold circuit board 404 at a height above metal base 400 that corresponds to a thickness of thermally conductive electrically insulating layer 406.

Referring now specifically to FIG. 6, a plurality of power switches 420 may be mounted on first surface 405*a* of circuit board 404. The plurality of power switches 420 may be configured as an inverter circuit, for example, as the three-phase inverter bridge driver circuit of power switch circuit 200 as shown in FIG. 3. For example, the plurality of power switches 420 (e.g., the inverter circuit, etc.) may include a plurality of high-side power switches arranged in a first row 421*a* on first surface 405*a* of circuit board 404 and a plurality of low-side power switches arranged in a second row 421*b* on first surface 405*a* of circuit board 404. As an example, the plurality of high-side power switches arranged in the first row 421*a* may include the three pairs of high-side FETs (Q1A and Q1B, Q2A and Q2B, and Q3A and Q3B) and the plurality of low-side power switches arranged in the second row 421*b* may include the three pairs of low-side FETs (Q4A and Q4B, Q5A and QSB, and Q6A and Q6B). In such an example, each pair of low-side FETs may include two low-side FETs coupled in parallel, and each pair of high-side FETs may include two high-side FETs coupled in parallel. Accordingly, each of the high-side power switches and each of the low-side power switches of the inverter circuit may be mounted on the same lower surface of circuit board 404 in close proximity to metal base 400 for better thermal communication with metal base 400. Interconnections configuring the FETs as a three-phase inverter circuit may be provided via metal traces on or through the circuit board 404, with DC_Bus and Gnd nodes of power switch circuit 200 electrically routed to the two power input terminals 412 or posts 413 and the outputs PU, PV and PW of power switch circuit 200 electrically routed to the three power output terminals 410 or posts 411.

A plurality of metal slugs 422 may be mounted on first surface 405*a* of circuit board 404. The plurality of metal slugs 422 may be electrically coupled to the plurality of power switches 420. The plurality of metal slugs 422 may enhance a thermal interface between the plurality of power switches 420 and metal base 400. For example, each power switch 420 may be electrically coupled to a different metal slug of the plurality of metal slugs 422 than the other power switches of the plurality of power switches 420. The plurality of metal slugs 422 may be arranged in a plurality of parallel rows on first surface 405*a* of circuit board 404. For example, the plurality of high-side power switches arranged in first row 421*a* (e.g., Q1A and Q1B, Q2A and Q2B, and Q3A and Q3B, etc.) may be mounted on first surface 405*a* of circuit board 404 between a first pair of parallel rows 423*a* and 423*b* of the plurality of parallel rows of the plurality of metal slugs 422, and/or the plurality of low-side power switches arranged in second row 421*b* (e.g., (Q4A and Q4B, Q5A and QSB, and Q6A and Q6B, etc.) may be mounted on first surface 405*a* of circuit board 404 between a second pair of parallel rows 423*b* and 423*c* of the plurality of parallel rows of the plurality of metal slugs 422.

At least one shunt component 424 (e.g., at least one of shunt resistor RU, shunt resistor RV, shunt resistor RW, or any combination thereof, etc.) may be mounted on first surface 405*a* of circuit board 404 and electrically coupled in series with at least one low-side power switch of the plurality of low-side power switches 420*b*. For example, at least one shunt component may be electrically coupled to a pair of low-side FETs of the three pairs of low-side FETs. At least one metal slug of the plurality of metal slugs 422 may be electrically coupled to the at least one shunt component 424. For example, because shunt resistors may generate heat, at least one metal slug of the plurality of metal slugs 422 may enhance a thermal interface between the at least one shunt component 424 and metal base 400. The at least one shunt component 424 (e.g., a plurality of shunt components 424, etc.) may be arranged in a third row 421*c* on first surface 405*a* of circuit board 404 between a third pair of parallel rows 423*c* and 423*d* of the plurality of parallel rows of the plurality of metal slugs 422.

Referring again to FIGS. 4A-8, a plurality of capacitors 426 may be mounted on second surface 405*b* of circuit board 404. The plurality of capacitors 426 may extend perpendicular from circuit board 404. For example, the plurality of capacitors 426 may be mounted between the two power input terminals 412 or posts 413 near the left side edge of circuit board 404 that extends perpendicular to the front edge of circuit board 404. In some implementations, the plurality of capacitors 426 are configured to form DC bus capacitor 108.

One or more connectors 428 (e.g., sealed connectors, non-sealed connectors, etc.) configured to provide at least one of a digital signal, an analog signal, or any combination thereof, may mounted on second surface 405*b* of circuit board 404. For example, a series of connectors 428 may be mounted near a rear edge of circuit board 404 that is parallel to the front edge of circuit board 404. Connectors 428 provide various digital and/or analog signal wires, including but not limited to temperature signals, Hall signals, speed signals, etc. to motor controller 110.

Components 408 of control unit 104 (FIG. 2), including motor controller 110 (e.g., a microcontroller, etc.), gate driver 112, and/or power supply regulator 114, may be mounted on second surface 405*b* of circuit board 404. For example, components of control unit 104 may be mounted between the plurality of output terminals 410 or posts 411 and the series of connectors 428. In some implementations, motor controller 110 may be configured to monitor a current passing through the at least one shunt component 424; and control, based on the current passing through the at least one shunt component 424, a field-oriented communication of electric motor 14 powered by control module 100.

Figure 9:
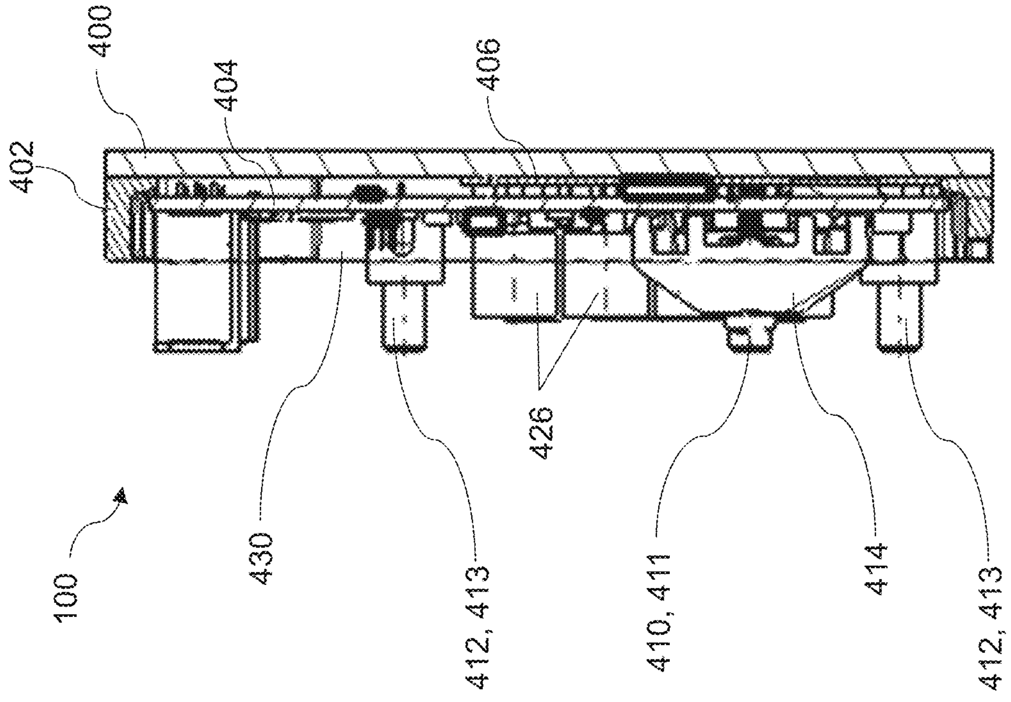
FIG. 9 depicts a cross-sectional side view of a control module including potting compound, according to some non-limiting embodiments or aspects.
Figure 10:
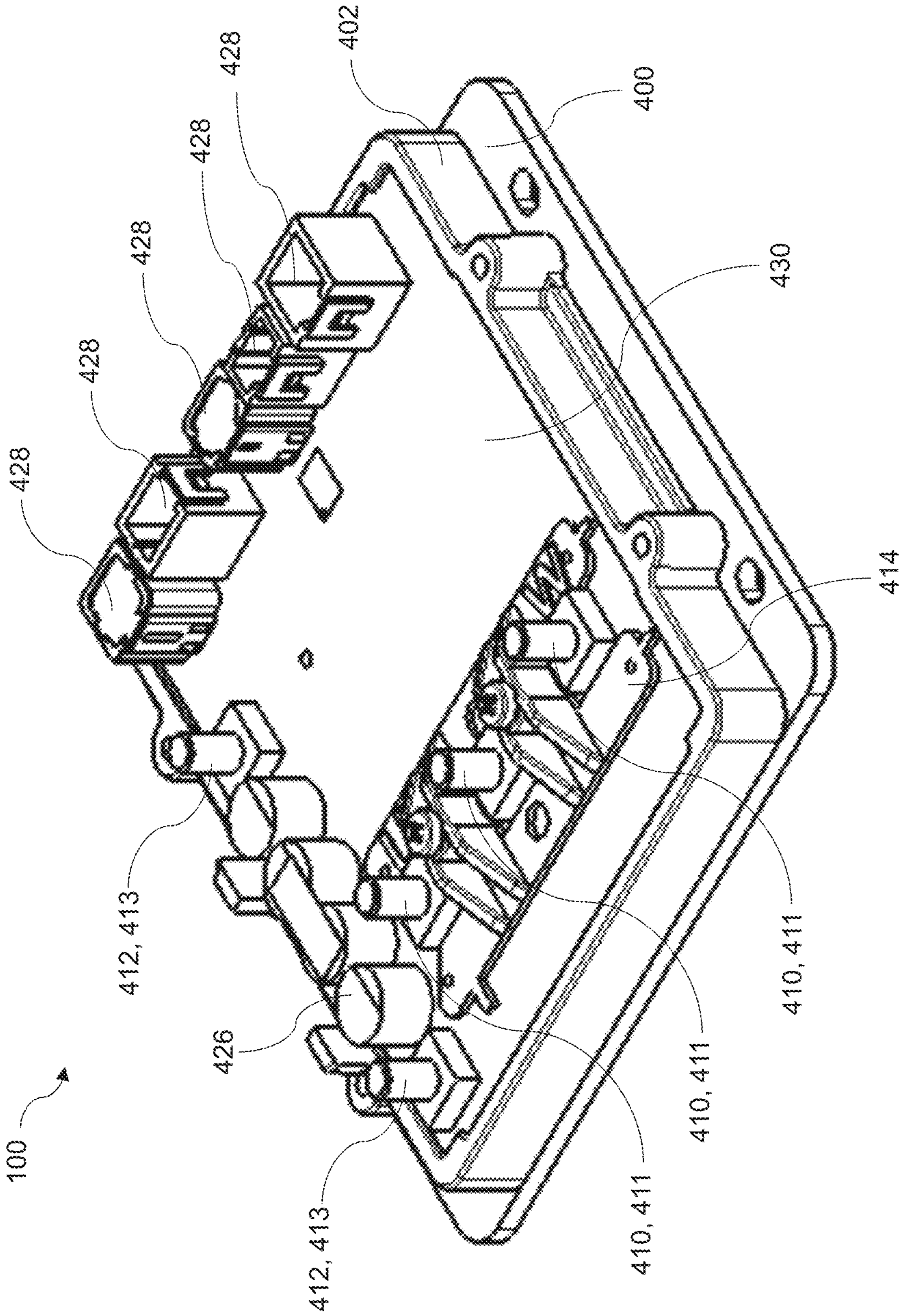
FIG. 10 depicts a perspective view of a control module including potting compound, according to some non-limiting embodiments or aspects.
Figure 11:
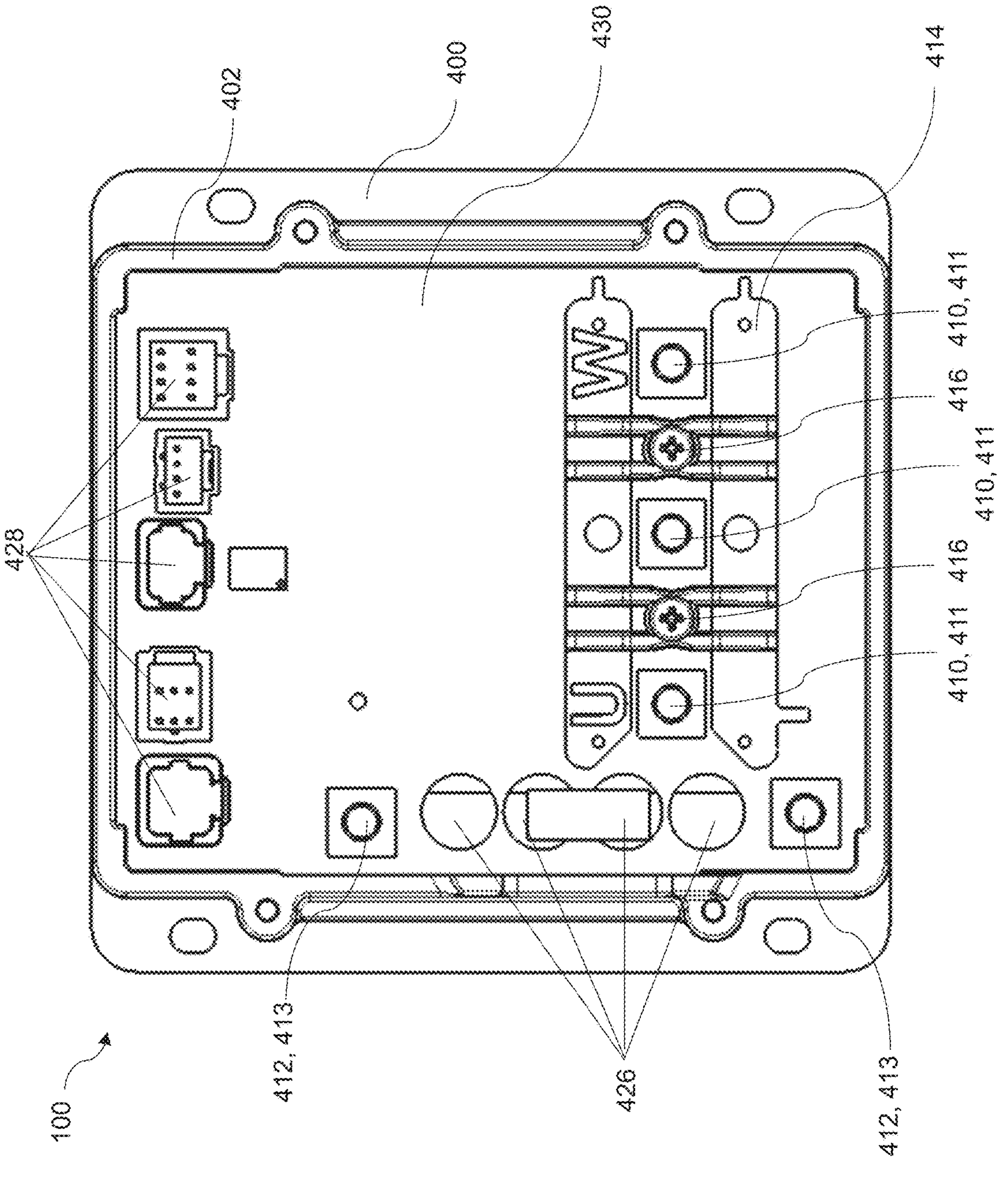
FIG. 11 depicts a top view of a control module including potting compound, according to some non-limiting embodiments or aspects.

FIG. 9 depicts a cross-sectional side view of control module 100 including potting compound 430, according to some non-limiting embodiments or aspects. FIG. 10 depicts a perspective view of control module 100 including potting compound 430, according to some non-limiting embodiments or aspects. FIG. 11 depicts a top view of control module 100 including potting compound 430, according to some non-limiting embodiments or aspects. As shown in FIGS. 9-11, potting compound 430 may be disposed within insulating wall 402 and on first surface 405*a* and/or second surface of circuit board 405*b*. When potting compound 430 is fully applied, portions of the plurality of output posts 411, the plurality of input posts 413, insulating frame 414, capacitors 426, and/or connectors 428 may be exposed above an upper surface of potting compound within insulating wall 402.

Figure 12A:
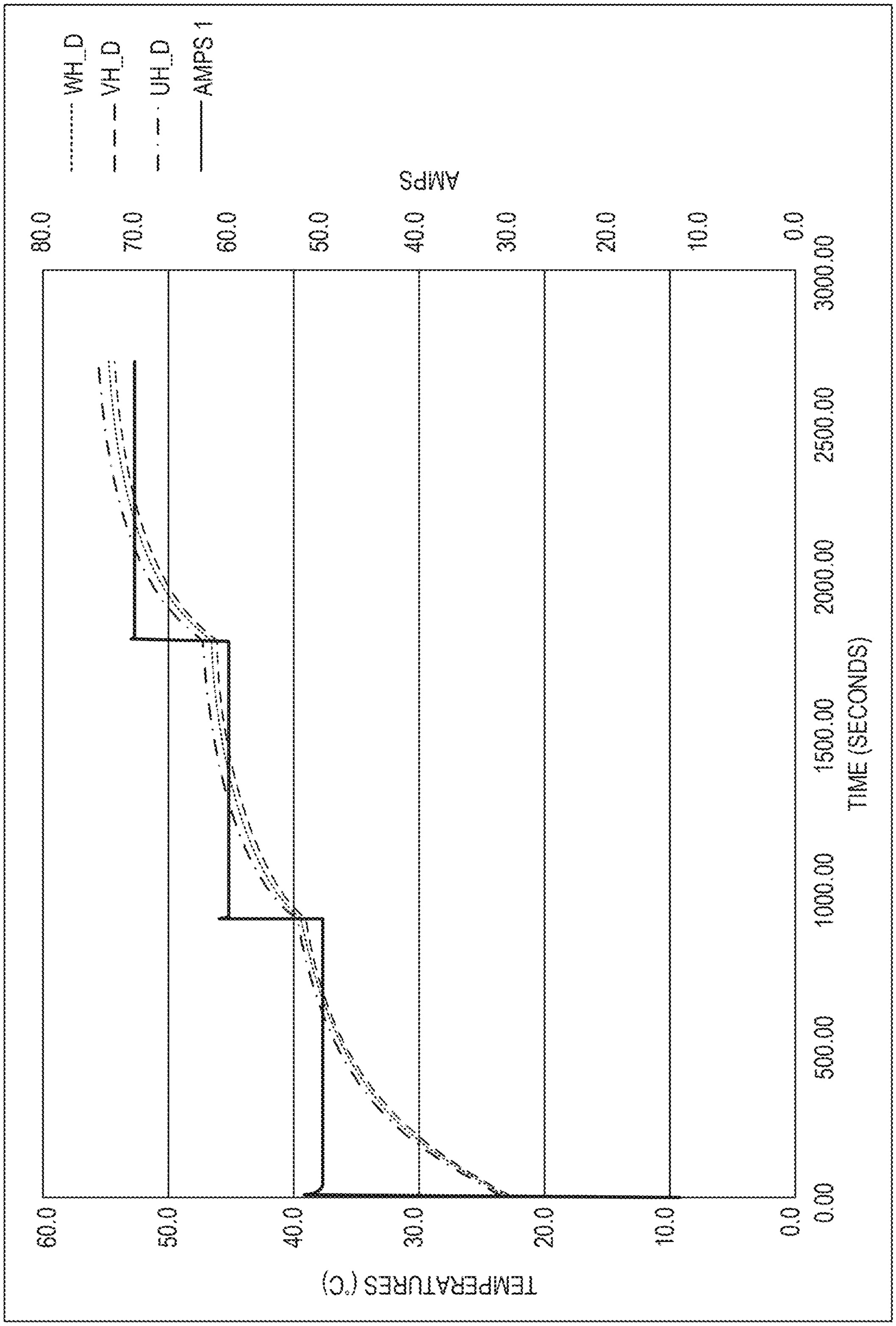
FIG. 12A depicts a graph of power switch temperature over time vs. current at fixed current load points of 50 amps, 60 amps, and 70 amps of a control module, according to some non-limiting embodiments or aspects.
Figure 12B:
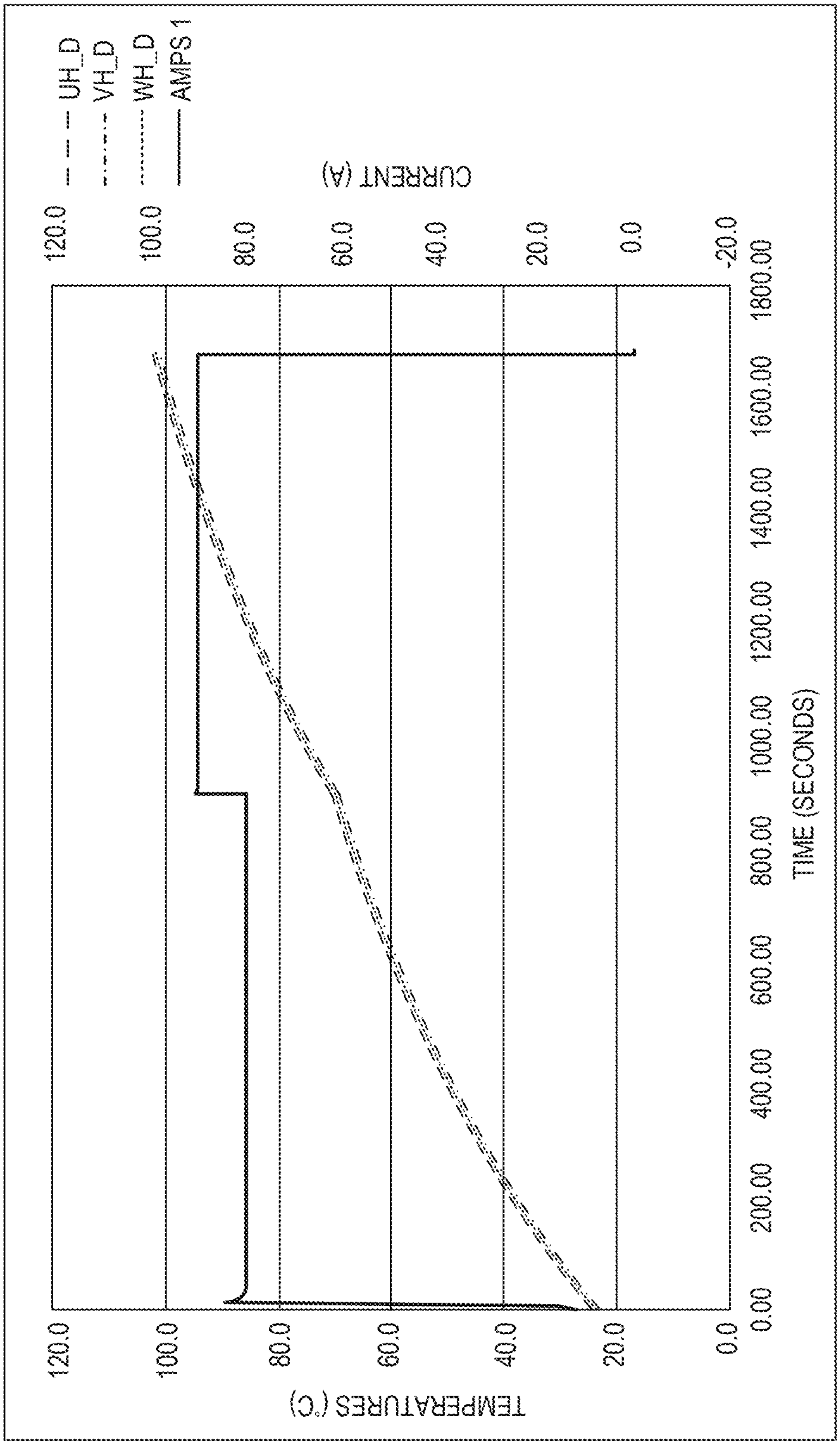
FIG. 12B depicts a graph of power switch temperature over time vs. current at fixed current load points of 80 amps and 90 amps of a control module, according to some non-limiting embodiments or aspects.

FIG. 12A depicts a graph of power switch temperature over time vs. current at fixed current load points of 50 amps, 60 amps, and 70 amps of a control module, according to some non-limiting embodiments or aspects, and FIG. 12B depicts a graph of power switch temperature over time vs. current at fixed current load points of 80 amps and 90 amps of a control module, according to some non-limiting embodiments or aspects. As shown in FIG. 12A, a height of control module 100 including metal base 400, circuit board 404, thermally conductive electrically insulating layer 406, and the plurality of power switches 420 may be less than or equal to approximately 6.5 mm, and control module 100 may be configured to sustain a continuous current output of approximately 50 A to 70 A at a nominal voltage level of approximately between 50V to 60V for a duration of at least 41 minutes while maintaining a temperature of the plurality of power switches at or below approximately 55 degrees Celsius. As shown in FIG. 12B, a height of control module 100 including metal base 400, circuit board 404, thermally conductive electrically insulating layer 406, and the plurality of power switches 420 may be less than or equal to approximately 6.5 mm, and control module 100 may be configured to sustain a continuous current output of approximately 70 A to 90 A at a nominal voltage level of approximately between 50V to 60V for a duration of at least 26 minutes while maintaining a temperature of the plurality of power switches at or below approximately 90 degrees Celsius.

Although embodiments have been described in detail for the purpose of illustration, it is to be understood that such detail is solely for that purpose and that the disclosure is not limited to the disclosed embodiments or aspects, but, on the contrary, is intended to cover modifications and equivalent arrangements that are within the spirit and scope of the appended claims. For example, it is to be understood that the present disclosure contemplates that, to the extent possible, one or more features of any embodiment or aspect can be combined with one or more features of any other embodiment or aspect.

What is claimed is:

1. A control module comprising:

a metal base;

an insulating wall fastened to the metal base;

a circuit board disposed within the insulating wall, wherein the circuit board includes a first surface that faces the metal base and a second surface opposite the first surface;

a plurality of power switches configured as an inverter circuit, wherein the plurality of power switches is mounted on the first surface of the circuit board;

a thermally conductive electrically insulating layer between the circuit board and the metal base;

a plurality of power output terminals mounted on the second surface of the circuit board;

an insulating frame extending between at least one pair of power output terminals of the plurality of power output terminals; and one or more fasteners received through the insulating frame, the circuit board, and the thermally conductive electrically insulating layer and fastened to the metal base.

2. The control module of claim 1, further comprising:

a plurality of metal slugs mounted on the first surface of the circuit board, wherein the plurality of metal slugs is electrically coupled to the plurality of power switches.

3. The control module of claim 2, wherein the plurality of metal slugs is arranged in a plurality of parallel rows on the first surface of the circuit board, wherein the inverter circuit includes a plurality of high-side power switches arranged in a first row on the first surface of the circuit board between a first pair of parallel rows of the plurality of parallel rows of the plurality of metal slugs and a plurality of low-side power switches arranged in a second row on the first surface of the circuit board between a second pair of parallel rows of the plurality of parallel rows of the plurality of metal slugs.

4. The control module of claim 3, further comprising:

at least one shunt component electrically coupled in series with at least one low-side power switch of the plurality of low-side power switches, wherein at least one metal slug of the plurality of metal slugs is electrically coupled to the at least one shunt component, and wherein the at least one shunt component is arranged in a third row on the first surface of the circuit board between a third pair of parallel rows of the plurality of parallel rows of the plurality of metal slugs.

5. The control module of claim 4, wherein the plurality of low-side power switches includes three pairs of low-side Field-Effect Transistors (FETs), wherein the plurality of high-side power switches includes three pairs of high-side FETs, wherein each pair of low-side FETs includes two low-side FETs coupled in parallel, and wherein each pair of high-side FETs includes two high-side FETs coupled in parallel.

6. The control module of claim 5, further comprising:

a microcontroller mounted on the second surface of the circuit board, wherein the at least one shunt component is electrically coupled to a pair of low-side FETs of the three pairs of low-side FETs, and wherein the microcontroller is configured to:

monitor a current passing through the at least one shunt component; and control, based on the current passing through the at least one shunt component, a field-oriented communication of an electric motor powered by the control module.

7. The control module of claim 1, wherein the plurality of power output terminals includes a first power output terminal, a second power output terminal, and a third power output terminal, wherein a first portion of the insulating frame extends between the first power output terminal and the second power output terminal, wherein a second portion of the insulating frame extends between the second power output terminal and the third power output terminal, wherein the one or more fasteners includes a first fastener received through the first portion of the insulating frame that extends between the first power output terminal and the second power output terminal and a second fastener received through the second portion of the insulating frame that extends between the second power output terminal and the third power output terminal, and wherein the first portion and the second portion of the insulating frame are connected by at least one third portion of the insulating frame.

8. The control module of claim 1, wherein the plurality of power output terminals includes a plurality of power output posts extending from the second surface of the circuit board.

9. The control module of claim 1, further comprising:

a plurality of capacitors mounted on the second surface of the circuit board;

one or more connectors configured to provide at least one of a digital signal, an analog signal, or any combination thereof, mounted on the second surface of the circuit board; and two power input terminals mounted on the second surface of the circuit board.

10. The control module of claim 1, further comprising:

a potting compound disposed within the insulating wall and on each of the first surface and the second surface of the circuit board.

11. The control module of claim 1, wherein the metal base is oriented along a first plane, wherein an upper edge of the insulating wall is oriented along a second plane, and wherein the circuit board is oriented between the first and second planes.

12. The control module of claim 1, wherein the insulating wall is fastened to the metal base via further fasteners received through the metal base and the insulating wall along second insertion axes opposite insertion axes of the fasteners.

13. The control module of claim 1, wherein the insulating frame absorbs at least a portion of a tension force applied by the fasteners to the circuit board.

14. The control module of claim 1, wherein a height of the control module including the metal base, the circuit board, and the plurality of power switches is less than or equal to approximately 6.5 mm, and wherein the control module is configured to sustain a continuous current output of approximately 70 A to 90 A at a nominal voltage level of approximately between 50V to 60V for a duration of at least 26 minutes while maintaining a temperature of the plurality of power switches at or below approximately 90 degrees Celsius.

15. An electric power tool comprising:

a tool housing;

an electric motor disposed in the tool housing;

a control module disposed in the tool housing, wherein the control module includes:

a metal base;

an insulating wall fastened to the metal base;

a circuit board disposed within the insulating wall, wherein the circuit board includes a first surface that faces the metal base and a second surface opposite the first surface;

a plurality of power switches configured as an inverter circuit, wherein the plurality of power switches is mounted on the first surface of the circuit board;

a thermally conductive electrically insulating layer between the circuit board and the metal base;

a plurality of power output terminals mounted on the second surface of the circuit board;

an insulating frame extending between at least one pair of power output terminals of the plurality of power output terminals; and one or more fasteners received through the insulating frame, the circuit board, and the thermally conductive electrically insulating layer and fastened to the metal base.

16. The electric power tool of claim 15, wherein the metal plate forms at least a portion of the tool housing.

17. The electric power tool of claim 15, wherein a thickness of the metal plate corresponds to an amount of continuous power consumption of the electric power tool.

18. A system comprising:

a power source;

a power consuming component; and a control module configured to control a supply of electric power from the power source to the power consuming component, wherein the control module includes:

a metal base;

an insulating wall fastened to the metal base;

a circuit board disposed within the insulating wall, wherein the circuit board includes a first surface that faces the metal base and a second surface opposite the first surface;

a plurality of power switches configured as an inverter circuit, wherein the plurality of power switches is mounted on the first surface of the circuit board;

a thermally conductive electrically insulating layer between the circuit board and the metal base;

a plurality of power output terminals mounted on the second surface of the circuit board;

an insulating frame extending between at least one pair of power output terminals of the plurality of power output terminals; and one or more fasteners received through the insulating frame, the circuit board, and the thermally conductive electrically insulating layer and fastened to the metal base.

19. The system of claim 18, wherein the power supply includes at least one battery.

20. The system of claim 18, wherein the power consuming component includes an electric motor.

* * * * *